(12) United States Patent
Hsu

(10) Patent No.: US 7,336,496 B1
(45) Date of Patent: Feb. 26, 2008

(54) FIXING STRUCTURE FOR COMPUTER MAINBOARD

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 21 days.

(21) Appl. No.: 11/532,006

(22) Filed: Sep. 14, 2006

(51) Int. Cl.
*H05K 7/20* (2006.01)
*F28F 7/00* (2006.01)
*H01L 23/34* (2006.01)

(52) U.S. Cl. .................... 361/719; 165/80.3; 165/185; 257/718; 257/719; 361/704; 361/697; 361/720

(58) Field of Classification Search ........ 257/718–719; 361/719–720
See application file for complete search history.

(56) References Cited

U.S. PATENT DOCUMENTS

| | | | | |
|---|---|---|---|---|
| 6,008,990 | A * | 12/1999 | Liu | 361/704 |
| 6,046,905 | A * | 4/2000 | Nelson et al. | 361/704 |
| 6,226,179 | B1 * | 5/2001 | Lee | 361/687 |
| 6,307,747 | B1 * | 10/2001 | Farnsworth et al. | 361/704 |
| 6,646,881 | B1 * | 11/2003 | Lai et al. | 361/719 |
| 6,654,254 | B2 * | 11/2003 | Szu et al. | 361/760 |
| 6,801,431 | B2 * | 10/2004 | Hartke et al. | 361/704 |
| 6,865,082 | B2 * | 3/2005 | Huang et al. | 361/700 |
| 7,126,824 | B2 * | 10/2006 | Lee et al. | 361/704 |
| 7,254,028 | B2 * | 8/2007 | Lee et al. | 361/704 |
| 7,262,969 | B2 * | 8/2007 | Lee et al. | 361/704 |
| 7,277,293 | B2 * | 10/2007 | Yang et al. | 361/719 |

* cited by examiner

*Primary Examiner*—Gregory D Thompson
(74) *Attorney, Agent, or Firm*—Workman Nydegger

(57) ABSTRACT

A fixing structure for computer mainboard is provided. The mainboard is clamped between a guard board and a back board. Through the appropriate arrangement of a snap pillar of the guard board and a gourd-shaped hole of the back board, after the snap pillar penetrates the mainboard and the gourd-shaped hole, the mainboard, the guard board and the back board are snapped by moving the back board properly. Furthermore, in the snap state, a fixing pillar penetrates the mainboard and the back board, so as to fasten the two boards. Thus, the step of locking by screws in the conventional art is simplified, and the assembly or disassembly can be fulfilled without any assembling/disassembling tools.

8 Claims, 5 Drawing Sheets

FIXING STRUCTURE FOR COMPUTER MAINBOARD

BACKGROUND OF THE INVENTION

1. Field of Invention

The present invention relates to a fixing structure for computer mainboard, and more particularly, to a fixing structure for computer mainboard that can fix the mainboard without removing the screws and is convenient in use.

2. Related Art

The computer industry develops at an amazing speed. According to statistics, the speed of the CPU in a computer is doubled every 1.5 years. Now, comparing the CPU 8088 in the early times with the P4 at present, the speed is raised several hundred times, and several types of the fixing module of the CPU have also been developed. At first, the CPU was directly fixed on the mainboard, then the CPU was plugged into a socket (Socket 7, Slot 1) by pins, and at present, the P4 CPU is soldered on a socket by the surface mounting technology (SMT). As the CPU generates a lot of heat in operation, a good heat sink has to be used to dissipate heat, thus protecting the CPU from breakdowns or damages. In view of the above, the current fixing modules of CPUs all comprise fixing devices for fixing heatsink fins or fans, so as to ensure the normal operation of the CPUs.

Please refer to FIG. 1 of a schematic view of the joining manner of the conventional fixing structure for computer mainboard. As shown in FIG. 1, a reinforcing back board P20 is added to a mainboard P10, so as to improve the capability of the mainboard 10 to bear the combined weight of the CPU, loading slot, fixing frame, heatsink fin, fixing clamp or fan, wherein the fixing frame, heatsink fin, fixing clamp and fan form a heatsink structure of the CPU. Moreover, to protect the CPU and other elements, a guard board P30 is added to the mainboard. Therefore, screws P41 are usually adopted to effectively join the above three boards (the mainboard P10, back board P20 and guard board P30) by means of locking. However, as the current computer components can be upgraded, when a user wants to upgrade the computer components, the screws P41 for locking the above three boards have to be removed, which makes the upgrading process very inconvenient.

Therefore, the mainboard P10, back board P20, and guard board P30 are joined with the screws P41 by means of locking, thus causing inconvenience as the screws P41 have to be removed first, and meanwhile, much time is needed for fastening the screws P41. Therefore, it is an objective of research and development in the industry to re-design a fixing structure for computer mainboard which is convenient in use and reduces the time needed for fastening the screws.

SUMMARY OF THE INVENTION

Accordingly, an objective of the present invention is to provide a fixing structure for computer mainboard, so as to solve the inconvenience as screws have to be removed in the conventional art that utilizes screws for locking, and meanwhile to overcome the disadvantage in the conventional art that disassembling tools have to be used to effectively loosen the locking with screws.

To achieve the above objective, the present invention provides a fixing structure for computer mainboard, so as to fix and support a computer mainboard. The fixing structure for computer mainboard comprises a mainboard, a guard board, a back board and at least one fixing pillar. The mainboard comprises at least one snap hole and at least one fixing hole. The guard board stacked on the mainboard has at least one snap pillar for penetrating the snap hole and disposed at a position corresponding to the snap hole on the mainboard. Moreover, the back board is stacked on the other side of the mainboard opposite to the guard board, and has at least one penetrating position and a fixing position. In addition, the back board has at least one gourd-shaped hole and a fastening hole. The gourd-shaped hole has a snap portion and a penetrating portion. When the back board is at the penetrating position, the above penetrating portion is corresponding to the snap hole and lets the snap pillar penetrate. Besides, when the back board is at the fixing position, the snap pillar is snapped at the snap portion. Meanwhile, the fastening hole is corresponding to the fixing hole, and when the back board is at the fixing position, the fixing pillar penetrates the fixing hole of the mainboard and is fixed in the fastening hole of the back board.

The present invention is a fixing structure for computer mainboard. Through the implementation of the fixing and supporting structure of a computer mainboard, the computer mainboard can be joined without the locking by screws. Moreover, as the screws do not have to be removed, the fixing and supporting structure of the computer mainboard can be effectively separated without disassembling tools. Therefore, the present invention is convenient in use, and doesn't increase the time for the locking process.

To acquire further understandings to the objective, structural features and functions of the present invention, they are illustrated in detail below with reference to the related embodiments and drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
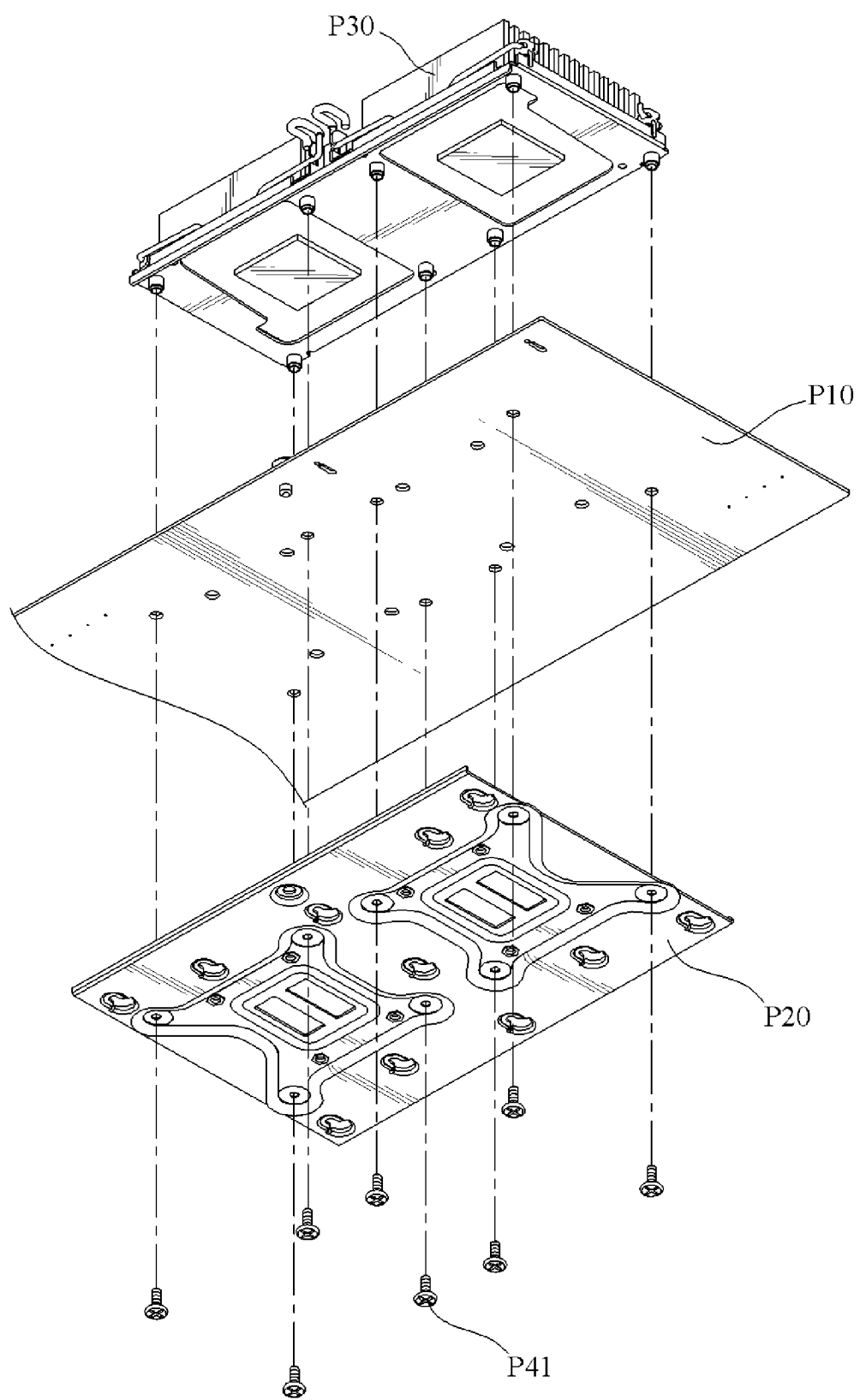
FIG. 1 is a schematic view of the joining manner of the conventional fixing structure for computer mainboard.
Figure 2:
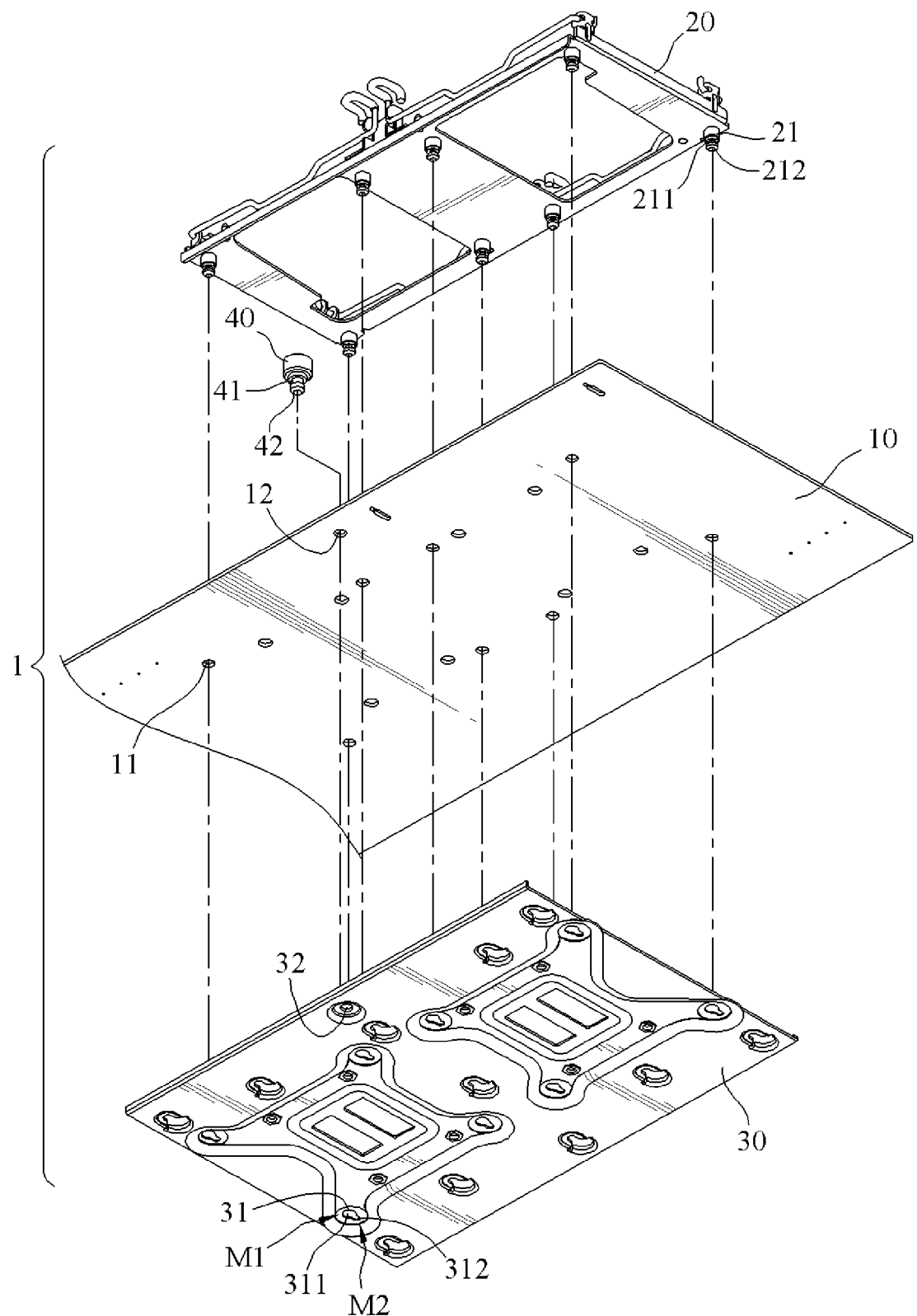
FIG. 2 is a schematic view of the fixing structure for computer mainboard before being joined according to a preferred embodiment of the present invention.
Figure 3:
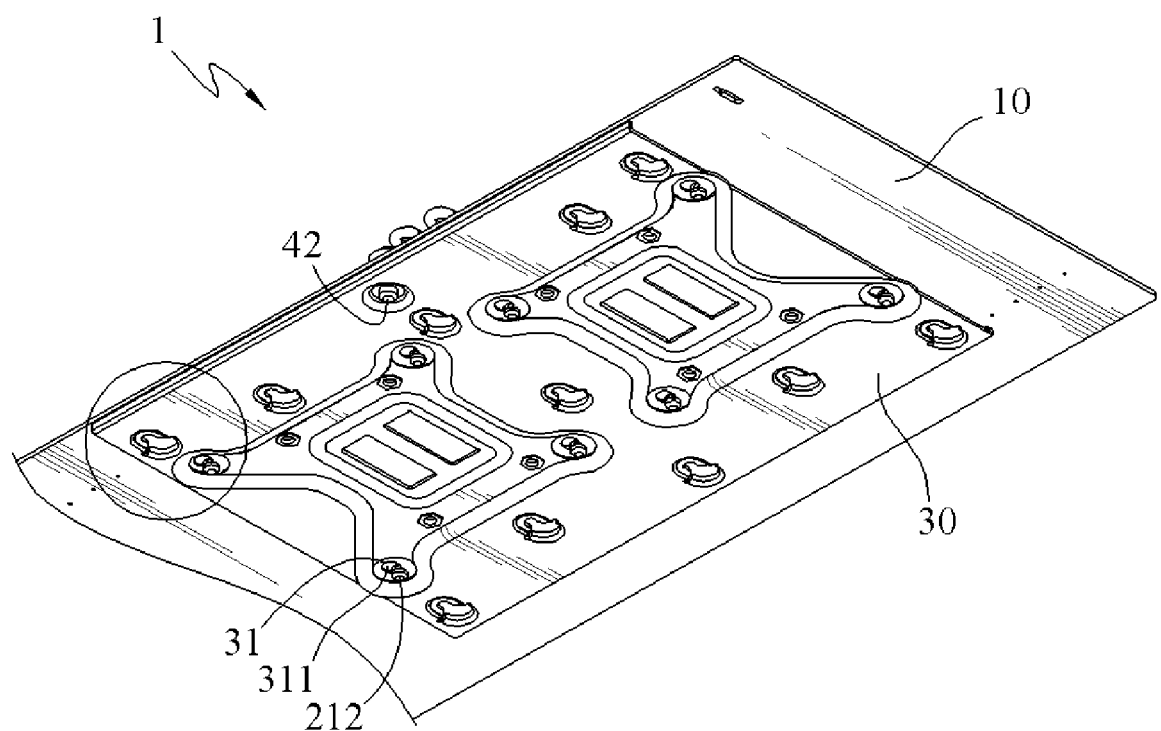
FIG. 3 is a schematic view of the fixing structure for computer mainboard after being joined according to a preferred embodiment of the present invention.

Please refer to FIGS. 2 and 3. FIG. 2 is a schematic view of the fixing structure for computer mainboard before being joined according to a preferred embodiment of the present invention. FIG. 3 is a schematic view of the fixing structure for computer mainboard after being joined according to the preferred embodiment of the present invention. As shown in FIGS. 2 and 3, is a fixing structure 1 for computer mainboard is used to fix and support a computer mainboard. The fixing structure 1 for computer mainboard comprises a mainboard 10, a guard board 20, a back board 30 and at least one fixing pillar 40. The mainboard 10 has at least one snap hole 11 and at least one fixing hole 12. The guard board 20 is stacked on the mainboard 10, and has at least one snap pillar 21 at a position corresponding to the snap hole 11. The snap pillar 21 has a stepped retaining portion 211 and a clamping portion 212 formed by the extension of the retaining portion 211. The transverse diameter of the retaining portion 211 is smaller than that of the clamping portion 212. The snap pillar 21 is used to penetrate the snap hole 11 of the mainboard 10. Furthermore, the back board 30 is stacked on the other side of the mainboard 10 opposite to the guard board 20. The back board 30 has a penetrating position M1 and a fixing position M2, and has at least one gourd-shaped hole 21 and at least one fastening hole 32. The gourd-shaped hole 31 has a penetrating portion 311 and a snap portion 312, wherein the aperture of the penetrating portion 311 is greater than that of the snap portion 312. The fixing pillar 40 has a stepped firmly-inserting portion 41 and an inserting portion 42 formed by the extension of the firmly-inserting portion 41, wherein the transverse diameter of the firmly-inserting portion 41 is smaller than that of the inserting portion 42. Moreover, the aperture of the fastening hole 32 of the back board 30 is smaller than the transverse diameter of the inserting portion 42 of the fixing pillar 40, but is greater than the transverse diameter of the firmly-inserting portion 41 of the fixing pillar 40.

Figure 4A:
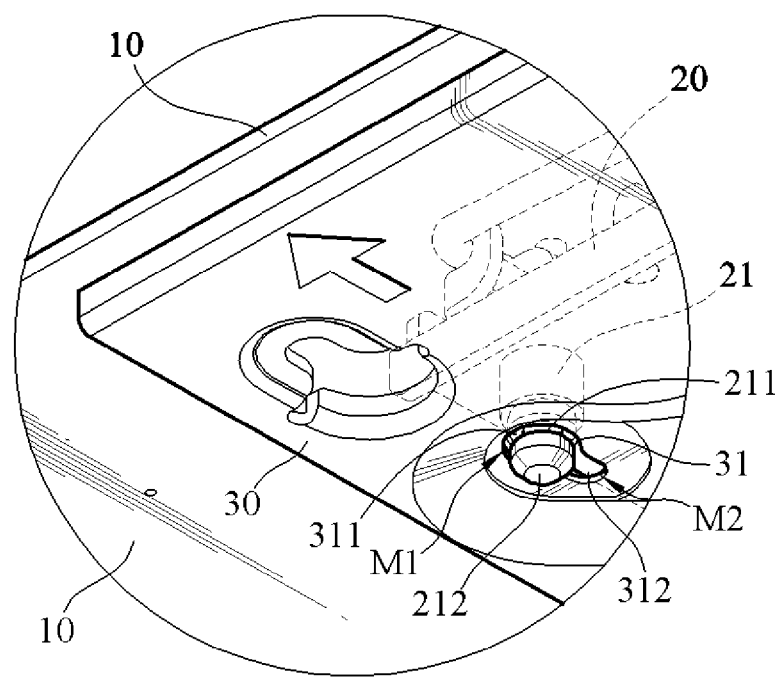
FIG. 4A is a schematic view of the back board of the fixing structure for computer mainboard being at the penetrating position according to the present invention.
Figure 4B:
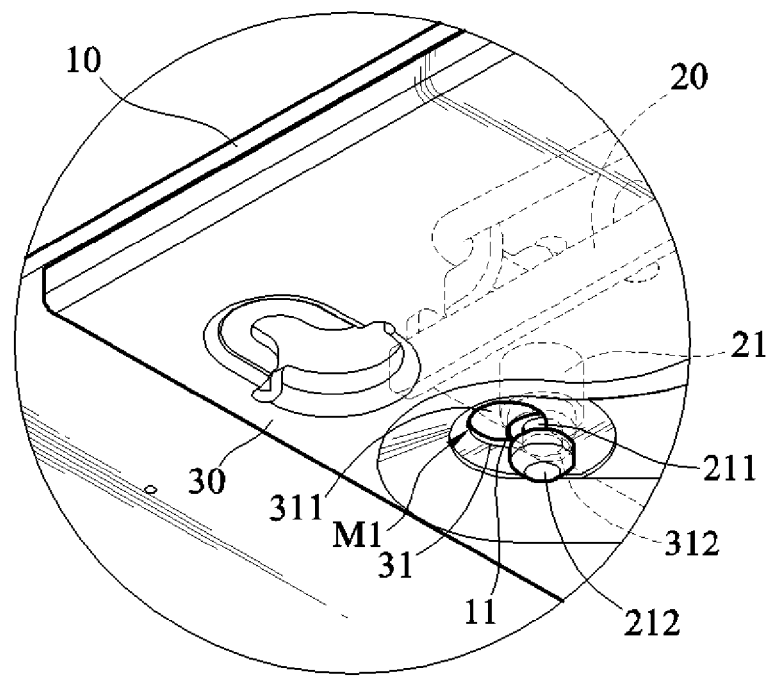
FIG. 4B is a schematic view of the back board of the fixing structure for computer mainboard being at the fixing position according to the present invention.

Please refer to FIGS. 4A and 4B. FIG. 4A is a schematic view of the back board of the fixing structure for computer mainboard being at the penetrating position according to the present invention. FIG. 4B is a schematic view of the back board of the fixing structure for computer mainboard being at the fixing position according to the present invention. As shown in FIGS. 4A and 4B, after the guard board 20, the mainboard 10 and the back board 30 are sequentially stacked, as the back board 30 is at the penetrating position M1, the penetrating portion 311 of the gourd-shaped hole 31 of the back board 30 is corresponding to the snap hole 11 of the mainboard 10, and the clamping portion 212 of the snap pillar 21 of the guard board 20 penetrates the snap hole 11 of the mainboard 10. Further, when the back board 30 is moved to the fixing position M2, the retaining portion 211 of the snap pillar 21 of the guard board is snapped in the snap portion 312 of the back board 30. Meanwhile, when the back board 30 is at the fixing position M2, as the inserting portion 42 of the fixing pillar 40 is elastic, the inserting portion 42 can penetrate the fixing hole 12 of the mainboard 10 by being applied with an appropriate force, and the firmly-inserting portion 41 of the fixing pillar 40 is fixed in the fixing hole 32 of the back board 30. On the contrary, when the fixing structure 1 for computer mainboard is to be loosened, the fixing pillar 40 fixed in the fixing hole 32 of the back board 30 is loosened first, and the back board 30 is moved from the fixing position M2 to the penetrating position M1. Thus, the fixing structure 1 for computer mainboard is disassembled easily.

Figure 5:
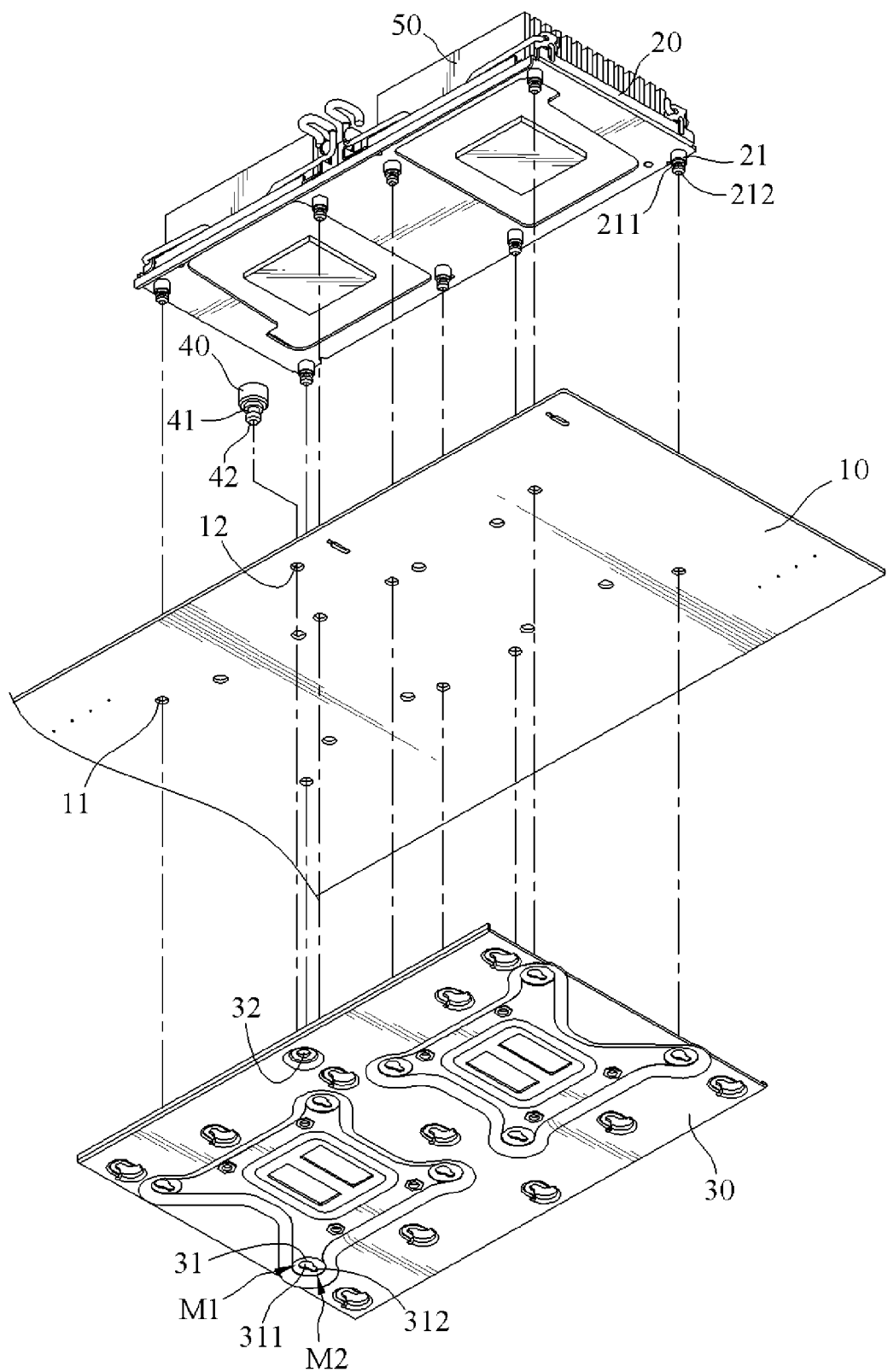
FIG. 5 is a joined schematic view of the fixing structure for computer mainboard comprising a heat sink according to a preferred embodiment of the present invention.

Please refer to FIG. 5 of a joined schematic view of the fixing structure for computer mainboard comprising a heat sink according to the preferred embodiment of the present invention. As shown in FIG. 5, the guard board 20 of the fixing structure 1 for computer mainboard further comprises a heat sink 50 fastened on the guard board 20, and the heat sink 50 can be a heatsink fan, a heatsink fin or a combination of a heatsink fan and a heatsink fin.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fixing structure for computer mainboard, for fixing and supporting a computer mainboard, wherein the mainboard comprises at least one snap hole and at least one fixing hole, the fixing structure comprising:

a guard board, stacked on the mainboard, wherein the guard board has at least one snap pillar at a position corresponding to the snap hole, such that the snap pillar penetrates the snap hole;

a back board, stacked on the other side of the mainboard opposite to the guard board, and having a penetrating position and a fixing position, wherein the back board has at least one gourd-shaped hole and at least one fastening hole, and the gourd-shaped hole has a snap portion and a penetrating portion; when the back board is at the penetrating position, the penetrating portion is corresponding to the snap hole, allowing the snap pillar to penetrate; and when the back board is at the fixing position, the snap pillar is snapped in the snap portion, and meanwhile the fastening hole is corresponding to the fixing hole; and at least one fixing pillar, wherein when the back board is at the fixing position, the fixing pillar penetrates the fixing hole of the mainboard and is fixed in the fastening hole of the back board.

2. The fixing structure for computer mainboard as claimed in claim 1, wherein the aperture of the penetrating portion of the gourd-shaped hole in the back board is greater than the aperture of the snap portion.

3. The fixing structure for computer mainboard as claimed in claim 1, wherein the snap pillar has a stepped retaining portion and a clamping portion formed by the extension of the retaining portion, and the transverse diameter of the retaining portion is smaller than the transverse diameter of the clamping portion; when the back board is at the penetrating position, the penetrating portion is corresponding to the snap hole, allowing the clamping portion of the snap pillar to penetrate; and when the back board is at the fixing position, the retaining portion of the snap pillar is snapped in the snap portion.

4. The fixing structure for computer mainboard as claimed in claim 1, wherein the fixing pillar has a stepped firmly-inserting portion and an inserting portion formed by the extension of the firmly-inserting portion, and the transverse diameter of the firmly-inserting portion is smaller than the transverse diameter of the inserting portion; when the back board is at the fixing position, the inserting portion of the fixing pillar penetrates the fixing hole of the mainboard, and the firmly-inserting portion of the fixing pillar is fixed in the fastening hole of the back board.

5. The fixing structure for computer mainboard as claimed in claim 4, wherein the inserting portion of the fixing pillar is elastic.

6. The fixing structure for computer mainboard as claimed in claim 4, wherein the aperture of the fastening hole of the back board is smaller than the transverse diameter of the inserting portion of the fixing pillar, but is greater than the transverse diameter of the firmly-inserting portion of the fixing pillar.

7. The fixing structure for computer mainboard as claimed in claim 1, wherein the guard board further comprises a heat sink fastened on the guard board.

8. The fixing structure for computer mainboard as claimed in claim 7, wherein the heat sink is a heatsink fan, a heatsink fin or a combination of a heatsink fan and a heatsink fin.

\* \* \* \* \*